USOO6311146B1

United States Patent
Hao et al.

(10) Patent No.: US 6,311,146 B1
(45) Date of Patent: *Oct. 30, 2001

(54) CIRCUIT SIMULATION WITH IMPROVED CIRCUIT PARTITIONING

(75) Inventors: Chong Hoc Hao, Basking Ridge; Alexander D. Schapira, Montclair, both of NJ (US)

(73) Assignee: Lucent Technologies Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/985,975

(22) Filed: Dec. 5, 1997

(51) Int. Cl.⁷ .............................. G06F 17/50; G06B 17/00

(52) U.S. Cl. .................................... 703/14; 703/2

(58) Field of Search ................ 395/500.35, 500.02, 395/500.03, 500.08, 500.18; 703/14, 15, 13, 2

(56) References Cited

U.S. PATENT DOCUMENTS

| | | | |
|---|---|---|---|
| 4,386,403 | * 5/1983 | Hsieh et al. | 395/500.18 |
| 5,062,067 | * 10/1991 | Schaefer et al. | 395/500.37 |
| 5,392,227 | * 2/1995 | Hiserote | 395/500.35 |
| 5,452,227 | * 9/1995 | Kelsey et al. | 395/500.04 |
| 5,499,191 | * 3/1996 | Young | 395/500.18 |
| 5,541,861 | * 7/1996 | Komoda et al. | 395/500.36 |
| 5,784,593 | * 7/1998 | Tseng et al. | 395/500.36 |

OTHER PUBLICATIONS

Devgan et al., "Efficient simulation of interconnect and mixed analog–digital circuits in ACES," Proc. of 8th Int. Conf. on VLSI Design, Jan. 1995, pp. 229–233.*

Wehbeh et al., "Hierarchical simulation of MOS circuits using extracted functional models," Proc. IEEE 1992 Int. Conf. on Computer Design: VLSI in Computers and Processors, ICCD '92, Oct. 1992, pp. 512–515.*

Zein et al., "HLSIM–a new hierarchical logic simulator in APL," VLSI Test Symp., 1992, 10th Anniversary, Design, Test and Applications: ASICs and Systems–on–a–Chip, IEEE Dig. of Papers, Apr. 1992, pp. 333–338.*

Jun, Y. H. et al. "Timing Simulator by Waveform Relaxation Considering the Feedback Effect," IEE Proc. Circuits, Devices and Systems. vol. 136, No. 1, Feb. 1989, pp. 38–42.*

Overhauser, D. et al. "Multi–Level Circuit Partitioning for Switch–Level Timing Simulation, " IEEE Int'l Symp. on Circuits and Systems. Jun. 1988, pp. 1361–1364 vol. 2.*

Deng, A. C. et al. "An Investigation on Parasitic Couplings and Feedback Loops in the CMOS Circuit," IEEE Int'l Symp. on Circuits and Systems. May 1989, pp. 864–867 vol. 2.*

Fernandez, J. et al. "Computer SImulation of Feedback Loops," Proc. of the Tactical Communications Conf. Apr. 1990, pp. 321–329.*

Beetem, J. "Hierarchical Topological Sorting of Apparent Loops via Partitioning," IEEE Trans. on Computer–Aided Design of Integrated Circuits, vol. 11, No. 5, May 1992, pp. 607–619.*

* cited by examiner

Primary Examiner—Tariq R. Hafiz
Assistant Examiner—Kyle J. Choi

(57) ABSTRACT

One or more groups, into which a circuit simulator may partition an overall circuit, that are determined to belong to a feedback loop, also known as cycles, may be merged into a single group. The length of the loop, which is the number of groups in the loop, determines whether or not the groups of a loop will be merged into a single group. More particularly, loops of a length less than or equal to a number are merged. The number may be specified by the user, or otherwise determined. Once a merged group is formed, its inputs and outputs are determined, and it is treated like any other previously existing group. Preferably, not all the groups are merged into a single group.

45 Claims, 3 Drawing Sheets

CIRCUIT SIMULATION WITH IMPROVED CIRCUIT PARTITIONING

TECHNICAL FIELD

This invention relates to circuit simulators, and more particularly, to circuit simulators which partition the overall circuit into disjoint groups of components which are separately solved during the simulation process.

BACKGROUND OF THE INVENTION

It is well known in the art that it is desirable to simulate the operation of a circuit, e.g., to determine how the circuit will perform prior to physically building it. One prior art simulation technique develops a mathematical model to represent the circuit, which is then solved to indicate the operation of the circuit. This model is developed by entering into the circuit simulator a representation of the circuit, such as may be produced as the output of a schematic capture system, e.g. in the form of a netlist. The elements of a netlist generally correspond one to one with the schematic of the circuit to be simulated as it was input into the schematic capture system.

Next, the overall circuit is partitioned into disjoint groups of components as a function of circuit connectivity as described in the netlist. When a circuit is partitioned for eventual simulation, the various resulting groups of components typically have many inputs and outputs, each of which connect to others of the groups, or are inputs or outputs of the overall circuit. For purposes herein, the term "group" includes either the components which result from a partition of the circuit, or a behavioral model of a circuit which is merely a software description of the operation of a circuit without being embodied in a particular circuit implementation of the behavioral model. It is possible that one or more feedback loops, also known as cycles, will be formed among the interconnected groups, a loop being a sequence of groups such that each group in the sequence has an output connected to an input of the next group in the sequence and the last group in the sequence has an output connected to an input of the first group in the sequence.

The simulator has access to mathematical models for—i.e., equations and, if necessary, parameters representing—the devices included within the netlist, and, after partitioning, these models are employed to represent the individual devices. The resulting equations of groups are then separately solved during the simulation process. By solving each of the groups separately the computation burden of solving the circuit is reduced. Furthermore, this solution takes into account feedback within the group. Feedback among the groups is taken into account by circulating events, but such feedback cannot be solved in all cases.

Note that the circuit simulator may be implemented by a computer with appropriate software. One such commercially available simulator is ATTSIM available from Lucent Technologies, Inc., the documentation of which is incorporated herein by reference.

SUMMARY OF THE INVENTION

We have recognized that, disadvantageously, the presence of feedback loops among the groups can result in either multiple re-evaluations of many groups, or worse, oscillation, preventing further simulation. Therefore, in accordance with the principles of the invention, groups which are determined to belong to a loop may be merged into a single group. The length of the loop, which is the number of groups in the loop, determines whether or not the groups of a loop will be merged into a single group. More particularly, loops of a length less than or equal to a number are merged. The number may be specified by the user, or otherwise determined. Once a merged group is formed, its inputs and outputs are determined, and it is treated like any other previously existing group. In other words, the equations for the merged group are derived from the components in the merged group just as for any originally existing group. Preferably, not all the groups are merged into a single group, which would eliminate the advantages of partitioning the circuit to simulating it.

DETAILED DESCRIPTION

Figure 1:
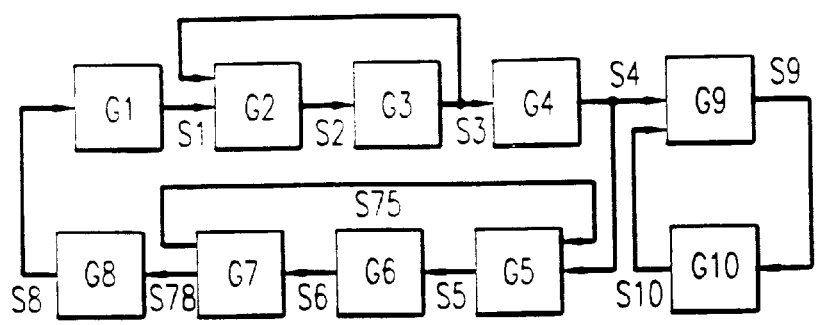
FIG. 1 shows an exemplary network of groups that results when an exemplary circuit (not shown) is initially partitioned for simulation.

FIG. 1 shows an exemplary network of groups that results when an exemplary circuit (not shown) is initially partitioned for simulation. In FIG. 1, groups G1 through G10 are shown and they are connected by signals S1 through S6, S75, S78 and S8 through S10.

When a circuit is partitioned into groups for simulation, there are two types of feedback that may result. The first is feedback within a group, and the second is feedback among the groups. Typically, e.g., in ATTSIM, feedback within a group is handled during the iterative solution of the differential equations which represent the circuits within the group. This feedback is taken into account essentially by simultaneous solution of the appropriate equations. Feedback among the groups is taken into account by the technique of circulating events but such feedback cannot be solved in all cases.

Feedback among the groups can arise because there is explicit feedback in the design, of which the designer is aware, or because of implicit feedback in the partitioned design, of which the designer is unaware. For example, a set-reset (S-R) latch built from two NAND gates has explicit feedback. If the NAND gates are built from MOSFETS, by default two groups will be created, with the output of each connected to an input of the other. Although a circuit designer may know about the internal feedback within an S-R latch, the designer may not be aware that the latch was partitioned into two cross-coupled groups. Similarly, if a large circuit has complicated behavior due to an effective internal state machine, partitioning may result in the creation of many groups, with there being feedback among the groups of which the circuit designer was not explicitly aware.

In the present invention, loops, starting with the shortest, i.e., of length two, if any, are identified, and then increasingly longer loops are identified, up to some limit, which may be determined experimentally. Since long loops can arise when there is naturally occurring feedback in the design, it is often unnecessary to merge such long loops, since in the limit, the entire design would be merged into a single group, entirely defeating the purpose of partitioning. Also, note that, for purposes of the invention, self feedback, which is a loop of length one, which occurs when a group has an output connected to one of its own inputs, is not important, and is, therefore, ignored and treated as if it didn't exist.

Identifying feedback among the groups is equivalent to finding loops of groups. A loop, also known as a cycle, is defined as a sequence of groups such that each group in the sequence has an output connected to an input of the next group in the sequence, and the last group in the sequence has an output connected to an input of the first group in the sequence. The number of groups in the sequence is the order or length of the loops. FIG. 1 shows four loops: two of length 2, the first consisting of groups G2 and G3 and the second consisting of G9 and G10; one of length 3, consisting of G5, G6, and G7; and one of length 8, consisting of G1, G2, G3, G4, G5, G6, G7, and G8.

In accordance with the principles of the invention, loops of increasing length, from two-group loops up to an n-group loop, where n is a parameter, are found. There be any number, including zero, of loops of any given length n. The groups forming a loop are then merged into a new group.

The interconnection of groups by signals can be described as a graph, the so-called group graph. In a group graph the groups are the nodes of the graph, and there is an edge of the graph from group i to group j if there is at least one signal which connects an output pin of group i to an input pin of group j. Thus, the group graph is a directed graph. Edges which correspond to self feedback are omitted. As a result, the graph has no edges from any node to itself.

Figure 2:
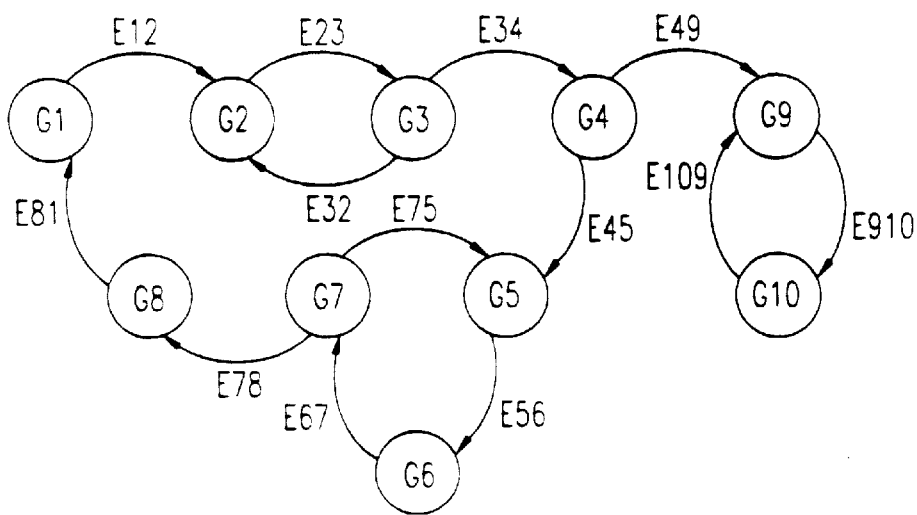
FIG. 2 shows a group graph for the network of groups shown in FIG. 1.

FIG. 2 shows the corresponding group graph for the network of groups shown in FIG. 1. It is possible that one signal in the network gives rise to more than one edge in the graph. This occurs when a signal fans out to more than one group. For example signal S3 fans out to groups G4 and G2, thus giving rise to edges E34 and E32. For purposes herein, fanout from a group to itself group does not result in an edge in the graph from a node to itself.

In accordance with an aspect of the invention, the group graph, in turn, is represented by a square adjacency matrix, A, which has one row and column for each group into which the circuit is currently partitioned. It has a non-null entry in row i, column j, if the corresponding graph has an edge from group i to group j. Thus, $A_{ij}$ is non-null if there is at least one signal from group i to group j. Because, as noted above, self feedback is ignored, A has no non-null diagonal elements. A is often a so-called "sparse matrix", since each group typically connects to only a few of the other groups. Table 1 shows the adjacency matrix for the sample group graph of FIG. 2.

TABLE 1

Adjacency matrix A for exemplary graph

|  | G1 | G2 | G3 | G4 | G5 | G6 | G7 | G8 | G9 | G10 |
|---|---|---|---|---|---|---|---|---|---|---|
| G1 | 0 | 1 | 0 | 0 | 0 | 0 | 0 | 0 | 0 | 0 |
| G2 | 0 | 0 | 1 | 0 | 0 | 0 | 0 | 0 | 0 | 0 |
| G3 | 0 | 1 | 0 | 1 | 0 | 0 | 0 | 0 | 0 | 0 |

TABLE 1-continued

Adjacency matrix A for exemplary graph

|  | G1 | G2 | G3 | G4 | G5 | G6 | G7 | G8 | G9 | G10 |
|---|---|---|---|---|---|---|---|---|---|---|
| G4 | 0 | 0 | 0 | 0 | 1 | 0 | 0 | 0 | 1 | 0 |
| G5 | 0 | 0 | 0 | 0 | 0 | 1 | 0 | 0 | 0 | 0 |
| G6 | 0 | 0 | 0 | 0 | 0 | 0 | 1 | 0 | 0 | 0 |
| G7 | 0 | 0 | 0 | 0 | 1 | 0 | 0 | 1 | 0 | 0 |
| G8 | 1 | 0 | 0 | 0 | 0 | 0 | 0 | 0 | 0 | 0 |
| G9 | 0 | 0 | 0 | 0 | 0 | 0 | 0 | 0 | 0 | 1 |
| G10 | 0 | 0 | 0 | 0 | 0 | 0 | 0 | 0 | 1 | 0 |

The adjacency matrix, A, can be derived from an incidence matrix, M, defined as follows: M has one row, i, for each group and one column, j, for each signal in the circuit that is an input or an output of any group. $M_{ij}$ is +1 if signal j is an output of group i, −1 if signal j is an input to group i but not also an output, and 0 otherwise. Since as noted, each group typically connects to only a few of the other groups, matrix M, like the adjacency matrix A, is often a sparse matrix. Incidence matrix M can be derived directly from the input-output lists for each group, which are developed in a well known manner as part of the partitioning process.

The adjacency matrix A may be developed by taking the product of the incidence matrix by its transpose, i.e., $A=M \cdot M^T$, alternatively written as, $A_{ij}=\Sigma M_{ik} \cdot M_{jk}$, where the non-commuting inner product operator is $(+1) \cdot (-1)=1$, other products being 0, and where 0+0=0, other sums being 1. To state the same in words, group i is adjacent to group j if there is at least one signal $S_k$ which is an output of group i, i.e., $M_{ik}=+1$ and an input to group j, i.e., $M_{jk}=-1$. That is to say, there is a path from group i to group j if there is at least one signal which is an output of group i and an input of group j. Table 2 is the incidence matrix M for the exemplary network of groups shown in FIG. 1. It can be shown that $A=(M>0) \cdot (M^T<0)$.

TABLE 2

Incidence Matrix M for exemplary graph

|  | S1 | S2 | S3 | S4 | S5 | S6 | S75 | S78 | S8 | S9 | S10 |
|---|---|---|---|---|---|---|---|---|---|---|---|
| G1 | 1 | 0 | 0 | 0 | 0 | 0 | 0 | 0 | −1 | 0 | 0 |
| G2 | −1 | 1 | −1 | 0 | 0 | 0 | 0 | 0 | 0 | 0 | 0 |
| G3 | 0 | −1 | 1 | 0 | 0 | 0 | 0 | 0 | 0 | 0 | 0 |
| G4 | 0 | 0 | −1 | 1 | 0 | 0 | 0 | 0 | 0 | 0 | 0 |
| G5 | 0 | 0 | 0 | −1 | 1 | 0 | −1 | 0 | 0 | 0 | 0 |
| G6 | 0 | 0 | 0 | 0 | −1 | 1 | 0 | 0 | 0 | 0 | 0 |
| G7 | 0 | 0 | 0 | 0 | 0 | −1 | 1 | 1 | 0 | 0 | 0 |
| G8 | 0 | 0 | 0 | 0 | 0 | 0 | 0 | −1 | 1 | 0 | 0 |
| G9 | 0 | 0 | 0 | −1 | 0 | 0 | 0 | 0 | 0 | 1 | −1 |
| G10 | 0 | 0 | 0 | 0 | 0 | 0 | 0 | 0 | 0 | −1 | 1 |

In accordance with an aspect of the invention, the diagonal elements of powers of the adjacency matrix A are used to identify loops. More specifically, the non-null diagonal elements of the matrix that are produced when matrix A is raised to a power indicate the existence of a path from group i to itself through one or more other groups, i.e., a loop, with a length equal to the power to which A is raised. For example, where the power is 2, the resulting matrix is $A^2$. Since $A_{ij}$ is non-null when there is a path from group i to group j, the matrix $A^2$ has non-zero elements if there is a path from group i to group j through some intermediate group k. In other words, there is a group k such that some signal is an output of group i and an input to group k, and another signal which is an output of group k and an input to group j. If $A^2_{ij}$ is non-null, there is a path from group i to itself through some group k, in other words, group i is in a loop of length two. Thus, the non-null diagonal elements of $A^2$ identify loops of length two.

In any circuit there may be more than one loop of length two. Subsets of the non-null diagonal elements identify disjoint loops of length two. To find the subsets of non-null diagonal elements it is necessary to save the contributions to the terms of the inner product when doing the multiplication of A by itself to find $A^2$. It is necessary to save the set of intermediate groups k on the path from i to j, and to identify paths having the same set of groups. This generalizes to higher powers of A. In a similar fashion, the non-null diagonal elements of higher powers of A correspond to longer loops.

TABLE 3

Square of Adjacency matrix for exemplary graph ($A^2$)

|  | G1 | G2 | G3 | G4 | G5 | G6 | G7 | G8 | G9 | G10 |
|---|---|---|---|---|---|---|---|---|---|---|
| G1 | 0 | 0 | 1 | 0 | 0 | 0 | 0 | 0 | 0 | 0 |
| G2 | 0 | 1 | 0 | 1 | 0 | 0 | 0 | 0 | 0 | 0 |
| G3 | 0 | 0 | 1 | 0 | 1 | 0 | 0 | 0 | 1 | 0 |
| G4 | 0 | 0 | 0 | 0 | 0 | 1 | 0 | 0 | 0 | 1 |
| G5 | 0 | 0 | 0 | 0 | 0 | 0 | 1 | 0 | 0 | 0 |
| G6 | 0 | 0 | 0 | 0 | 1 | 0 | 0 | 1 | 0 | 0 |
| G7 | 1 | 0 | 0 | 0 | 0 | 1 | 0 | 0 | 0 | 0 |
| G8 | 0 | 1 | 0 | 0 | 0 | 0 | 0 | 0 | 0 | 0 |
| G9 | 0 | 0 | 0 | 0 | 0 | 0 | 0 | 0 | 1 | 0 |
| G10 | 0 | 0 | 0 | 0 | 0 | 0 | 0 | 0 | 0 | 1 |

Table 3 shows the matrix $A^2$ for the exemplary network of groups shown in FIG. 1. The non-null diagonal elements of Table 3 are shown in bold. The terms of the inner product which gave rise to both $A^2_{2,2}$ and $A^2_{3,3}$ are G2, G3, while the terms which gave rise to both $A^2_{9,9}$ and $A^2_{10,10}$ are G9, G10. Hence G2 and G3 are in a loop of length two, and G9 and G10 are likewise in a separate loop of length two.

Further higher powers of A are obtained by multiplying the previously obtained power of A by A again. Non-null diagonal elements of the higher powers indicate longer loops. For example, Table 4, which shows $A^3$ for the exemplary network of groups shown in FIG. 1, indicates the loop formed by G5, G6, and G7. The inner product terms giving rise to $A^3_{5,5}$ are $A^2_{5,7}$ and $A_{7,5}$. Those for $A^3_{6,6}$ are $A^2_{6,5}$ and $A^2_{5,6}$ comes from $A_{6,7} \cdot A_{7,5}$ yielding the same set of three groups). Similarly, the groups involved in the inner product yielding $A^3_{7,7}$ also reduce to the same loop. Hence there is only one loop of length three consisting of groups G5, G6, and G7. The formation of higher powers of A, including saving the terms of the inner products for the diagonal elements, is repeated until loops of the desired length are found. In no case can a loop be longer than the total number of groups.

TABLE 4

Square of Adjacency matrix for exemplary graph ($A^3$)

|  | G1 | G2 | G3 | G4 | G5 | G6 | G7 | G8 | G9 | G10 |
|---|---|---|---|---|---|---|---|---|---|---|
| G1 | 0 | 1 | 0 | 1 | 0 | 0 | 0 | 0 | 0 | 0 |
| G2 | 0 | 0 | 1 | 0 | 1 | 0 | 0 | 0 | 1 | 0 |
| G3 | 0 | 1 | 0 | 1 | 0 | 1 | 0 | 0 | 0 | 1 |
| G4 | 0 | 0 | 0 | 0 | 0 | 0 | 1 | 0 | 1 | 0 |
| G5 | 0 | 0 | 0 | 0 | 1 | 0 | 0 | 1 | 0 | 0 |
| G6 | 1 | 0 | 0 | 0 | 0 | 1 | 0 | 0 | 0 | 0 |
| G7 | 0 | 1 | 0 | 0 | 0 | 0 | 1 | 0 | 0 | 0 |
| G8 | 0 | 0 | 1 | 0 | 0 | 0 | 0 | 0 | 0 | 0 |
| G9 | 0 | 0 | 0 | 0 | 0 | 0 | 0 | 0 | 0 | 1 |
| G10 | 0 | 0 | 0 | 0 | 0 | 0 | 0 | 0 | 1 | 0 |

In the event that a group appears in more than one subset of groups corresponding to the terms of the inner product from which a non-null diagonal element of a power of A was formed, this indicates that the group is part of more than one loop of the same length. In such a case, the various separate subsets of groups for each of the loops in which the common group appears are replaced by a single group having as its members the union of the groups corresponding to the subsets of groups in which the common group appears. For example, if there exists two loops of length three, one including groups A, B, and C, the other including groups A, D, and E, then when groups of length three are determined a union will be formed of all five groups A, B, C, D, and E. Subsequently, all the groups in the several loops of the same length that have a common group will be merged, as described hereinbelow.

In accordance with the principles of the invention, after loops of the desired length are identified, the groups in each loop are merged into a single group. This operation has two parts: a) the elements in all of the groups in the loops have to be combined; and b) the boundary signals of the merged group are established, with their directions appropriately determined.

Combining the elements of all groups on a loop is performed by taking the union of the elements of each of the groups to be merged.

To determine the boundary signals, and the directions thereof, for the merged group first an initial set S, which is the union of boundary signals of all of the groups to be merged is developed, i.e., $S = \{S_k\}$. Next, each signal $S_k$ of set S is processed in turn.

If signal $S_k$ connects to only groups in the set to be merged, i.e., groups on the loop, and is an input to at least one and an output of at least one, then signal $S_k$ has become an internal signal of the merged group, i.e., it is not connected to any point outside the merged group. Therefore, signal $S_k$ is not a boundary signal of the merged group and it is removed from set S.

If signal $S_k$ is not an output of any of the groups in the set to be merged, then signal $S_k$ is designated as an input of the merged group. Otherwise, if signal $S_k$ connects to a group not on the loop, or to a behavioral model, then signal $S_k$ is designated as an output of the merged group. Note that this is because such a signal $S_k$ cannot be an input of the merged group since it was an output of one of the groups being merged, and therefore could not have also been an output of any other group or model.

Figure 3:
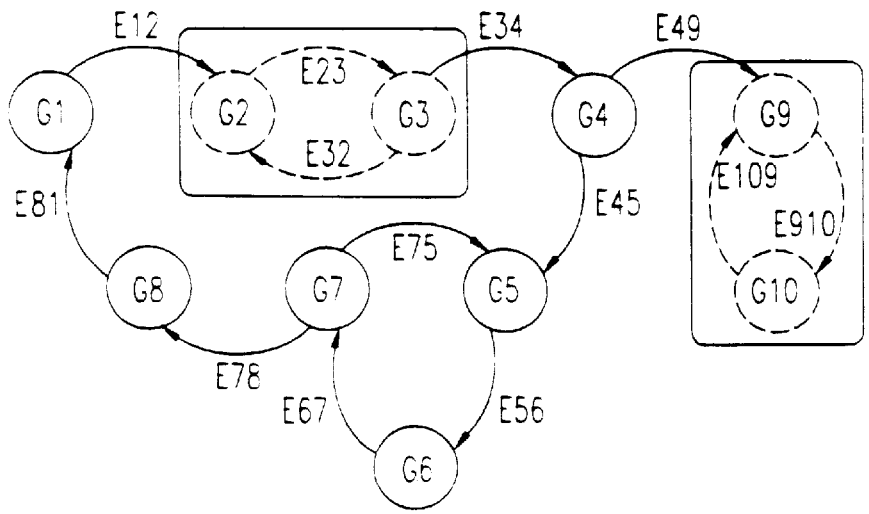
FIG. 3 shows the group graph of the exemplary network of FIG. 1 after detecting and eliminating loops of length two has been performed.

After detecting and eliminating loops of length two, the group graph of the exemplary network of FIG. 1 is shown in FIG. 3. Note that the signals corresponding to edges E23, E32, E109, and E910, which were edges in the group graph of FIG. 2 for the fully partitioned network of FIG. 1 have, in FIG. 3, become internal to their respective merged groups. Signal S1 corresponding to edge E12 has been designated an input to merged group G2/G3 and signal S4 corresponding to edge E49 has been designated an input to merged group G9/G10. Similarly, signal S3 corresponding to edge E34 has been designated an output of merged group G2/G3.

Figure 4:
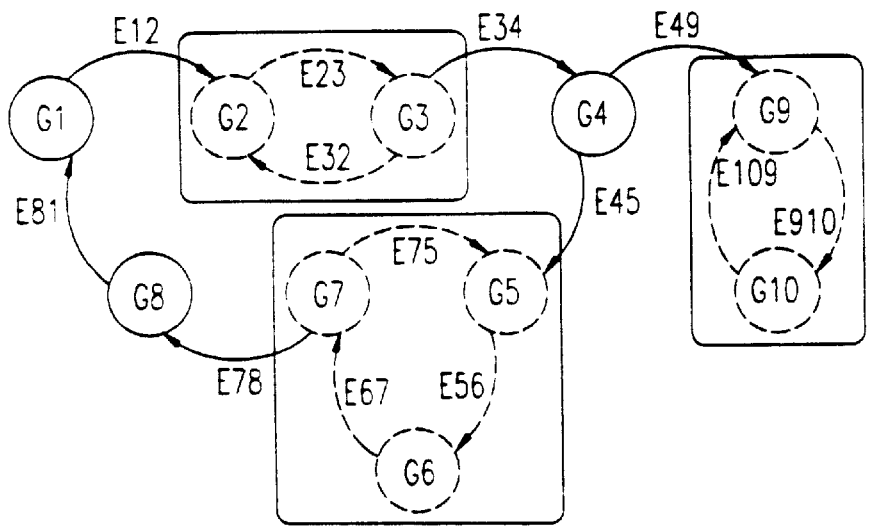
FIG. 4 shows the group graph of the exemplary network of FIG. 1 after detecting and eliminating loops of both length two and length three has been performed.
Figure 5:
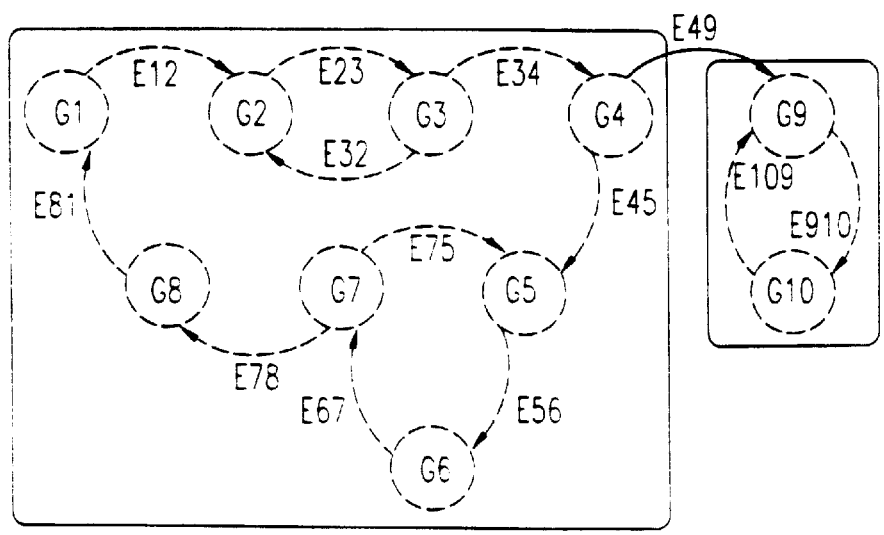
FIG. 5 shows the group graph of the exemplary network of FIG. 1 after all loops have been removed.

Similarly, FIG. 4 shows the group graph of the exemplary network of FIG. 1 after detection and elimination of both loops of length two and loops of length three. Likewise, FIG. 5 shows the group graph of the exemplary network of FIG. 1 after all loops have been removed.

In one embodiment of the invention, the matrix operations described above are not performed using any standard or sparse matrix package. Instead, the adjacency matrix A, and its powers, $A^n$, are represented by a list of their rows, which consist of lists of group identifiers, e.g., represented by pointers, which correspond to their non-empty columns. In other words, each row of the nth power of the adjacency matrix is the list of groups reachable from each group in n-steps. The inner products are performed by employing nested for loops, with implicit indexing controlled by comparison of group pointers. A union operation is used to identify loops corresponding to common subsets of groups of each given length. Only the original adjacency matrix, A, and the current power are retained. Each subsequent power is obtained from the previous power by adding the additional groups reachable by one additional edge of the original adjacency matrix; this corresponds to multiplication by adjacency matrix A. The subsets of common groups on a loop are accumulated only when computing the diagonal elements of each new power.

Some possible policies for applying feedback elimination are: 1) remove all loops up to a fixed length; 2) remove only all instances of the shortest loops; or 3) remove all loops, which, as noted above, may negate the benefits of partitioning.

Figure 6:
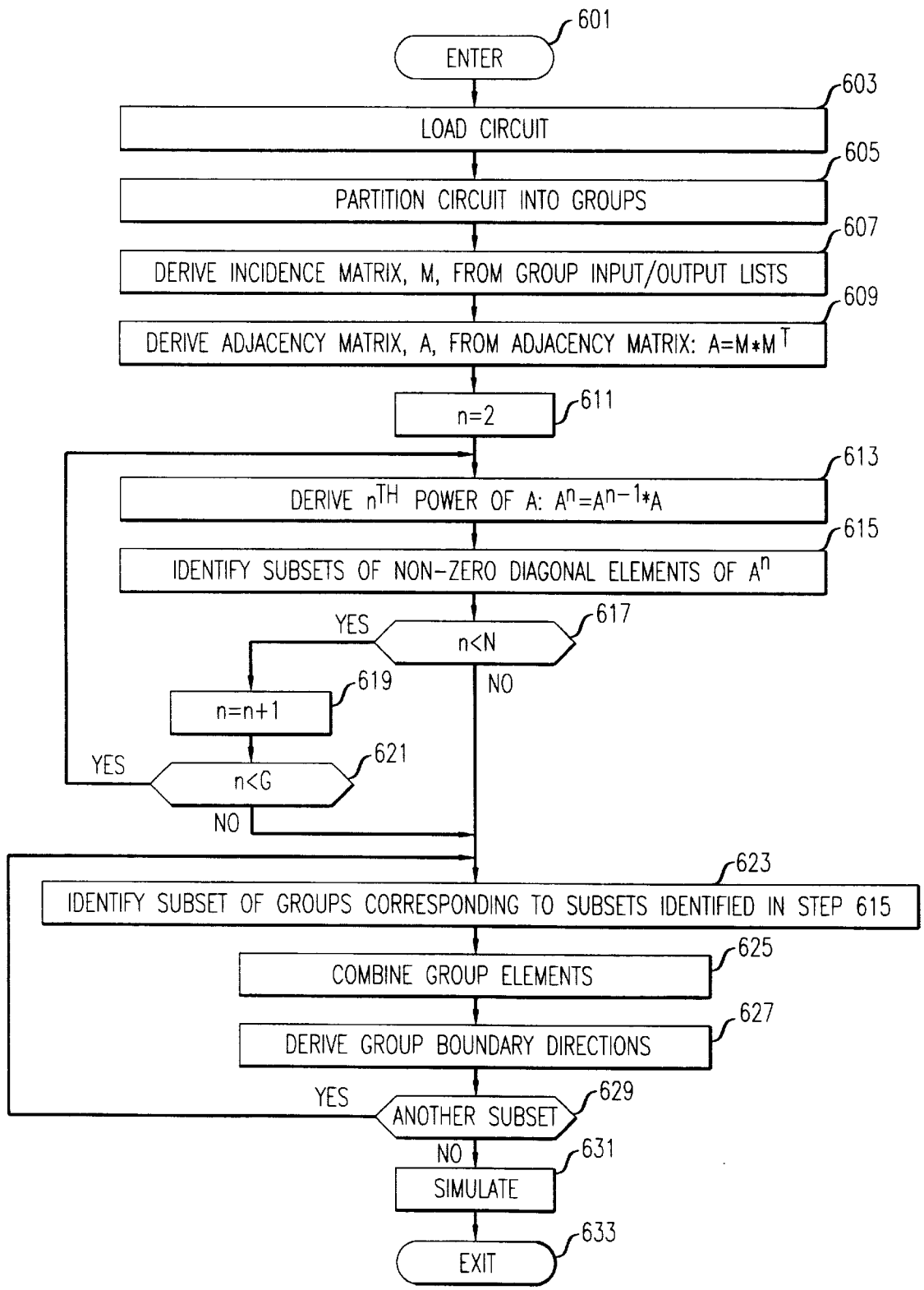
FIG. 6 shows a generalized flow chart of a process for implementing the invention.

FIG. 6 shows a generalized flow chart of a process for implementing the foregoing in an exemplary manner. The process begins in step 601 when the simulator is activated to simulate a circuit. Next, in step 603, the circuit, e.g., its netlist, is loaded into the circuit simulator. Thereafter, the partitioning of the circuit in the conventional manner is performed in step 605.

The process then undertakes to identify the loops that exist among the groups. To this end, in step 607, the incidence matrix M is derived from the group input/output lists which were developed as part of the partitioning process, and, in step 609, the adjacency matrix A is derived from the incidence matrix M by computing $A=M \cdot M^T$.

Next, the loops of groups which resulted from the partitioning process and having a length of less than or equal to N, a predetermined number, e.g., selected by the user, are merged. To this end, the value of a variable n, which determines the loop length that is currently being processed, is initialized to two, in step 611. Then, in step 613, the nth power of A is determined, e.g., by computing $A^n = A^{n-1} \cdot A$. The non-null diagonal elements of $A^n$, which indicate groups within loops of length n, and which particular groups belong to which particular loops, if any, are identified in step 615. In other words, the subsets of groups that give rise to non-zero diagonal elements of $A^n$ are identified. If there are two or more loops that have a group that is common to those loops, i.e., a contribution is made by such a group to a non-zero diagonal element that belongs to the subsets identifying such loops, then all the groups of those loops will be identified as part of a single subset of groups.

Thereafter, conditional branch point 617 tests to determine if n<N. If the test result in step 617 is YES, control passes to step 619, in which n is incremented. Control then passes to conditional branch point 621, which tests to determine if n<G, where G is the number of groups produced as a result of the original partitioning of the circuit. If the test result in step 621 is YES, indicating that greater length loops may still be found, control passes back to step 613, and the process continues as described above.

If the test result in step 617 is NO, or the test result in step 621 is NO, which indicates that all the loops of groups from the original partitioning which have a length of less than or equal to the lesser of G or N have been identified, control passes to step 623 to begin the process of merging the groups of each loop into a single group. More specifically, in step 623, unique subsets of groups which are part of a particular loop and correspond to the non-null diagonal elements of $A^n$ accumulated in step 615 are identified. Next, the elements of the identified groups are merged, which is achieved by: a) combining the elements of the identified groups on the loop in step 625; and then b) determining the group boundary signals, and their appropriate direction; in step 627. Conditional branch point 629 tests to determine if there remain any unique subset of groups that correspond to a loop that have not yet been processed. If the test result in step 629 is YES, control passes back to step 623 to process the groups on the next as-yet-unprocessed loop. If the test result in step 629 is NO, control passes to step 631, in which the circuit is simulated as it is currently partitioned into groups, which may include original groups as well as merged groups. The process then exits in step 633.

The foregoing merely illustrates the principles of the inventions. It will thus be appreciated that those skilled in the art will be able to devise various arrangements which, although not explicitly described or shown herein, embody the principles of the invention and are included within its spirit and scope.

What is claimed is:

1. A method for use in simulating a circuit which is represented at a first level, which is partitioned into groups using a second representation of said circuit that is at a second level that is lower than said first level, the method comprising the steps of:

determining if there exists any loops among said groups; and merging said groups of said determined loops when a length of said determined loops is less than a number that is selected prior to performing any merging in said merging step;

wherein at least one of said loops are formed as a result of having partitioned said circuit into said groups at said second level and is not inherent in said circuit at said first level of said circuit.

2. The invention as defined in claim 1 wherein loops having a length greater than said determined number are left unaffected.

3. The invention as defined in claim 1 further including the step of determining which signals are boundary signals for at least one merged group which is formed as a result of said merging step.

4. The invention as defined in claim 3 further including the step of determining which, if any, of said boundary signals are input signals of said at least one merged group.

5. The invention as defined in claim 3 further including the step of determining which of said boundary signals, if any, are output signals of said at least one merged group.

6. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the step of deriving the nth power of an adjacency matrix for said circuit, wherein n is the length of said determined loops.

7. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the step of deriving up to the Nth power of an adjacency matrix for said circuit, wherein N is the maximum length of said determined loops.

8. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the steps of:

deriving the nth power of an adjacency matrix for said circuit, wherein n is the length of said determined loops; and identifying the non-zero diagonal elements of said nth power of said adjacency matrix for said circuit.

9. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the steps of:

deriving the Nth power of an adjacency matrix for said circuit, wherein N is the maximum length of said determined loops; and identifying the non-zero diagonal elements of said Nth power of said adjacency matrix for said circuit.

10. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the steps of:

deriving the powers from 2 through N of an adjacency matrix for said circuit, wherein N is the maximum length of said determined loops, or through the number of groups into which said circuit is partitioned; and identifying the non-zero diagonal elements of said derived power of said adjacency matrix for said circuit.

11. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the steps of:

deriving the powers from 2 through N of an adjacency matrix for said circuit, wherein N is the maximum length of said determined loops, or through the number of groups into which said circuit is partitioned; and identifying each of said groups which contributes to a non-zero diagonal element of any of said powers of said adjacency matrix as being on a loop.

12. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the steps of:

deriving the powers from 2 through N of an adjacency matrix for said circuit, wherein N is the maximum length of said determined loops, or through the number of groups into which said circuit is partitioned; and identifying each power of said adjacency matrix as having at least one non-zero diagonal elements as corresponding to a loop of groups that has a length equal to the power to which said adjacency matrix was raised.

13. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the steps of:

deriving an adjacency matrix for said circuit from an incidence matrix of said circuit; and deriving the nth power of said adjacency matrix for said circuit, wherein n is the length of said determined loops.

14. The invention as defined in claim 1 further comprising the step of:

determining which of said groups belongs to each of said loops.

15. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step comprises the steps of:

deriving the nth power of an adjacency matrix for said circuit, wherein n is the length of said determined loops; and said method further comprises the step of determining which groups contributed to non-zero diagonal elements of said nth power of said adjacency matrix for said circuit.

16. The invention as defined in claim 15 further including the step of taking the union of groups corresponding to said non-zero diagonal elements when said non-zero diagonal elements correspond to loops having at least one group in common.

17. The invention as defined in claim 1 wherein a merged group does not constitute the entirety of said circuit.

18. The invention as defined in claim 1 wherein said circuit is represented in a computer readable form.

19. The invention as defined in claim 1 wherein said circuit is represented in a computer readable form in the form of a computer readable netlist.

20. The invention as defined in claim 1 wherein said groups include at least one group that includes components of said circuit.

21. The invention as defined in claim 1 wherein said groups include at least one group that includes a behavioral model of a portion of said circuit.

22. The invention as defined in claim 1 further including the step of simulating said circuit using at least one merged group.

23. The invention as defined in claim 1 wherein said groups are groups of components.

24. The invention as defined in claim 1 wherein said groups of said determined loops are merged only if the length of the group is also greater than one.

25. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step includes deriving the powers from 2 through N of an adjacency matrix for said circuit, wherein N is the maximum length of said determined loops, or through the number of groups into which said circuit is partitioned, said deriving being performed using sparse-matrix techniques.

26. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step includes deriving the powers from 2 through N of an adjacency matrix for said circuit, wherein N is the maximum length of said determined loops, or through the number of groups into which said circuit is partitioned, said deriving being performed using lists of rows of group identifiers for non-empty columns of said adjacency matrix and its powers.

27. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step includes the step of deriving the powers from 2 through N of an adjacency matrix for said circuit, wherein N is the maximum length of said determined loops, or through the number of groups into which said circuit is partitioned, said deriving being performed using lists of rows of group identifiers for non-empty columns of said adjacency matrix and its powers, wherein only each subsequently derived power of said adjacency matrix and said adjacency matrix are employed for subsequent derivation.

28. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step includes the steps of:

deriving the powers from 2 through N of an adjacency matrix for said circuit, wherein N is the maximum length of said determined loops, or through the number of groups into which said circuit is partitioned, said deriving being performed using lists of rows of group identifiers for non-empty columns of said adjacency matrix and its powers, wherein only each subsequently derived power of said adjacency matrix and said adjacency matrix are employed for subsequent derivation; and subsets of groups on a loop are accumulated only when computing diagonal elements of each of said derived power of said adjacency matrix.

29. A method for use in simulating a circuit, a representation of which is partitioned into groups, the method comprising the steps of:

determining if there exists any loops among said groups; and merging said groups of said determined loops when a length of said determined loops is less than a number that is selected prior to performing any merging in said merging step;

wherein said determining step includes deriving the powers from 2 through N of an adjacency matrix for said circuit, wherein N is the maximum length of said determined loops, or through the number of groups into which said circuit is partitioned, said deriving being performed using lists of rows of group identifiers for non-empty columns of matrices, and wherein a union operation is used to combine loops of the same length having a common group.

30. The invention as defined in claim 1 wherein said circuit is an analog circuit.

31. A method for use in connection with simulating a circuit represented at a first level in a computer readable form, the method comprising the steps of:

partitioning said circuit representation into a set of groups using a second representation of said circuit that is at a second level that is lower than said first level; and merging at least one of said groups with at least one other of said groups to form at least one merged group wherein said at least one of said groups and said at least one other of said groups are part of a feedback loop having a length that is less than a number that is selected prior to performing any merging in said merging step;

wherein at least one of said loops are formed as a result of having partitioned said circuit into said groups and is not inherent in said circuit at said first level of said circuit.

32. The invention as defined in claim 31 further including the step of determining which signals are boundary signals for said at least one merged group.

33. The invention as defined in claim 31 further comprising the step of:

simulating said circuit by solving said at least one merged group as a single group and said circuit has not become a single group.

34. The invention as defined in claim 31 wherein said circuit represented in a computer readable form is in the form of a computer readable netlist.

35. A processor for use in connection with simulating a circuit represented at a first level in a computer readable form, the processor executing software for performing the steps of:

partitioning said circuit representation into a set of groups using a second representation of said circuit that is at a second level that is lower than said first level; and merging at least one of said groups with at least one other of said groups to form at least one merged group;

wherein said at least one of said groups and said at least one other of said groups are part of a cycle having a length that is less than a number that is selected prior to performing any merging in said merging step;

wherein said cycle is formed as a result of having partitioned said circuit into said groups at said second level of representation and is not inherent in said circuit at said first level of representation.

36. The invention as defined in claim 35 further wherein said processor further performs the step of simulating said circuit using a second set of groups which is the same as said set of groups into which said circuit was partitioned in said partitioning step except that said at least one merged group is a group of said second set of groups, and said at least one group and said at least other group are not a group of said second set of groups.

37. A method for use in connection with simulating a circuit represented in a computer readable form at a first level, said circuit being partitioned, as part of the simulation process, into a first set of groups using a computer readable representation of said circuit that is at a second level that is lower than said first level, the method comprising the step of forming a merged group by merging at least one of said groups of said first set with at least one other of said groups of said first set;

wherein said at least one of said groups of said first set and said at least one other of said groups of said first set are part of a feedback loop which is formed as a result of having partitioned said circuit into said groups and is not inherent in said circuit at said first level and having a length that is less than a number that is selected prior to performing any merging in said forming step.

38. A method for use in connection with simulating a circuit represented in a computer readable form at a first level, said circuit being partitioned, as part of its simulation, into a first set of groups using a second computer readable representation of said circuit that is at a second level that is lower than said first level, the method comprising the step of forming a second set of groups from said first said of groups, said second set of groups including at least one group formed by merging at least one of said groups of said first set with at least one other of said groups of said first set;

wherein said at least one of said groups of said first set and said at least one other of said groups of said first set are part of a feedback loop which is formed as a result of having partitioned said circuit into said groups at said second level and is not inherent in said circuit at said first level and having a length that is less than a number that is selected prior to performing any merging in said forming step.

39. Apparatus for use in simulating a circuit, the apparatus comprising:

means for receiving a representation of a circuit at a first level;

means for partitioning said circuit into a set of groups of components using a representation of said circuit that is at a second level that is lower than said first level; and means for forming a second set of groups by merging at least a first and a second of said groups of said first set that form a loop of a length into a single merged group said length having been designated prior to operation of said means for forming for said circuit;

wherein at least one of said loops are formed by said means for partitioning and is not inherent in said circuit at said first level.

40. The invention as defined in claim 39 wherein said have boundary signals, said apparatus comprising:

means for determining which of said boundary signals of said at least first and second groups are boundary signals of said merged group.

41. A method for use in simulating a circuit which is represented at a first level, which is partitioned into groups of components using a representation of said circuit that is at a second level that is lower than said first level by a circuit simulation system, the method comprising the steps of:

determining if there exists any loops among said groups, at least one of said loops being formed as a result of having partitioned said circuit into said groups and is not inherent in said circuit at said first level; and merging said groups of said determined loops when a length of said determined loops is less than a number that is selected prior to performing said determining and merging steps.

42. A method for use in simulating a circuit which is represented at a first level and which is partitioned into a plurality of groups of components using a representation of said circuit that is at a second level that is lower than said first level by a circuit simulation system, and for which the largest loops of said groups that can be formed of a length greater than one and less than or equal to a number are identified, the method comprising the step of, merging said groups on each respective one of said largest loops into a respective merged group;

wherein said number is designated prior to performing any merging in said merging step and wherein at least one of said loops are formed as a result of having partitioned said circuit into said groups and is not inherent in said circuit at said first level of representation of said circuit.

43. The invention as defined in claim 42 further comprising the step of identifying boundary signals for each of said merged groups.

44. The invention as defined in claim 43 further comprising the step of simulating said circuit using as groups for simulation said merged groups and any remaining unmerged groups of said plurality.

45. A method for use in simulating a circuit represented in a computer readable form at a first level, the method comprising the steps of:

partitioning said circuit representation into a set of subcircuit representations using a representation of said circuit that is at a second level that is lower than said first level; and merging at least one of said subcircuit representations with at least one other of said subcircuit representations to form at least one merged subcircuit representation;

wherein said at least one of said subcircuit representations and said at least one other of said subcircuit representations are on a feedback loop having a length designated prior to performing any merging in said merging step, said feedback loop resulting from partitioning said circuit as originally represented in said computer readable form into said set of subcircuit representations and not being within said circuit as originally represented in said computer readable form at a first level.

* * * * *